United States Patent [19]
Rolfe

[11] 4,434,497
[45] Feb. 28, 1984

[54] RESPONSE TIME BIDIRECTIONAL CIRCUITRY

[75] Inventor: Robert M. Rolfe, Summit, N.J.

[73] Assignee: Bell Telephone Laboratories, Incorporated, Murray Hill, N.J.

[21] Appl. No.: 333,445

[22] Filed: Dec. 22, 1981

[51] Int. Cl.³ .............................................. H04K 5/14
[52] U.S. Cl. ..................... 375/7; 178/63 R; 178/69 F; 179/170 G; 370/31
[58] Field of Search ............... 178/63 R, 63 E, 69 R, 178/69 M, 69 N, 69 F; 179/170 R, 170 G, 170.2, 174; 330/61 A, 292, 76; 333/213, 214; 370/24, 29, 31, 41; 375/7, 36; 455/39, 73, 78, 79

[56] References Cited
U.S. PATENT DOCUMENTS

| 586,755 | 7/1897 | Barr | 178/69 F |
| 3,042,759 | 7/1962 | Bonner | 179/170 G |
| 3,814,866 | 6/1974 | Japenga | 179/170 G |
| 4,154,978 | 5/1979 | Tu | 370/31 |

Primary Examiner—Benedict V. Safourek
Attorney, Agent, or Firm—Irwin Ostroff

[57] ABSTRACT

Bidirectional circuitry, which includes two amplifiers, each having a capacitor connected between an input and an output terminal thereof, and two interrupt transistors, acts to provide amplification and/or level shifting of information between two transceivers while also reducing capacitive loading and thus enhancing response time.

6 Claims, 1 Drawing Figure

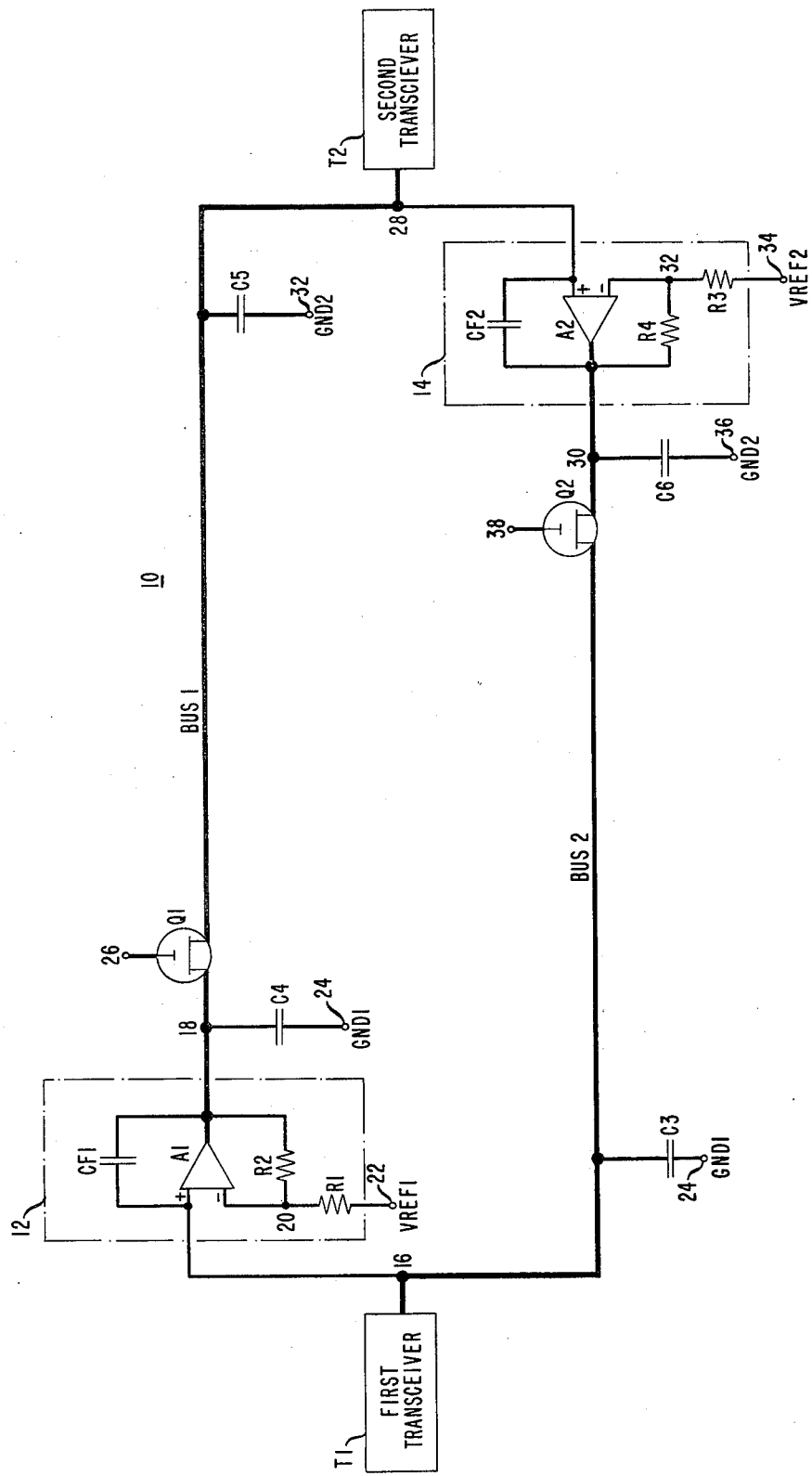

RESPONSE TIME BIDIRECTIONAL CIRCUITRY

BACKGROUND OF THE INVENTION

This invention relates to circuitry for enhancing the speed of transfer of information from one source to another and specifically for providing a bilateral path between two transceivers with separate circuitry in each leg of the path which selectively acts to amplify/level shift and/or acts as a one terminal negative capacitance generator which reduces capacitance loading and thus enhances response time.

Many of today's electronics systems use MOS circuitry which selectively has to drive a relatively high capacitance line (bus). One avenue to try and enhance response time is to increase the physical size of all the MOS drive devices so as to increase the drive capability by lowering the resistance. This also increases the capicitance on the bus which degrades response time. A point is reached at which increasing the size of the MOS driver devices proportionally increases the capacitance on the bus such that there is little or no enhancement of response time.

The publication entitled *Applications of Operational Amplifier Third-Generation Techniques* by Jerald Graeme (pp. 38–40), describes an amplifier which uses a capacitor coupled between an input terminal and the output terminal to cancel some of the parasitic capacitance associated with the input terminal of the amplifier. This serves to enhance the response time of the amplifier but does little to enhance the response time through a heavily capacitively loaded data bus which may be coupled to the output of the amplifier.

U.S. patent application Ser. No. 333,400, which is being filed concurrently with the present application and in which there is a common assignee and one common inventor, discloses essentially a one terminal negative capacitance generator circuit which can be coupled to a data bus (conductor) and acts to reduce the loading capacitance thereon. This serves to enhance the response time of information sent through the conductor.

It is desirable in many instances to provide a bilateral path between two transceivers which includes amplification and/or level shifting circuitry and in which capacitive loading on electrical conduits (data buses) connecting the transceivers is reduced such that response time is enhanced.

SUMMARY OF THE INVENTION

One embodiment of the present invention is directed to bidirectional circuitry which couples two transceivers. The bidirectional circuitry essentially comprises two amplifiers, each of which has a separate capacitor coupled between amplifier input and output terminals and which may be denoted as an amplifier-capacitor combination, and two switching devices which each have a control terminal and first and second output terminals. The output terminal of the first amplifier is coupled through the output terminals of the first switching means to a first electrical conduit (bus or data bus) which is coupled to the second transceiver and to an input terminal of the second amplifier. The output terminal of the second amplifier is coupled through the output terminals of the second switching means to a second electrical conduit (bus or data bus) which is coupled to the first transceiver and to an input terminal of the first amplifier.

When it is desired to transmit information from the first transceiver to the second transceiver, the first switching is biased on and the second transceiver is biased off. Information passes from the first transceiver through the first amplifier, the first switching device, the first bus, and to the second transceiver and to the input terminal of the second amplifier. The information cannot pass from the output terminal of the second amplifier since the second switching means is biased off. The first amplifier-capacitor combination acts to amplify and/or level shift the information and to reduce all load capacitance at the input terminal thereof. Under these conditions the second amplifier-capacitor combination reduces load capacitance at the second transceiver by functioning essentially as a single terminal negative capacitance generator. The reduction of load capacitance serves to enhance the response time of information sent from the first to the second transceiver.

If it is desired to send information from the second to the first transceiver, then the second switching device is biased on and the first switching device is biased off. Information passes from the second transceiver through the second amplifier, the second switching device, the second bus and to the first transceiver and to the input of the first amplifier. Information cannot pass from the output terminal of the first amplifier since the first switching device is biased off. The second amplifier-capacitor combination now acts to amplify and/or level shift the information and to reduce all load capacitance at the input terminal thereof. Under these conditions the first amplifier-capacitor combination reduces load capacitance at the first transceiver by functioning essentially as a single terminal negative capacitance generator. The reduction in load capacitance serves to enhance the response time of information sent from the second to the first transceiver.

It is thus clear that the first and second amplifier-capacitor combinations switch functions depending on the desired direction of the flow of information between the transceivers.

These and other novel features and advantages of the present invention are better understood from consideration of the following detailed description taken in conjunction with the accompanying drawing.

BRIEF DESCRIPTION OF THE DRAWING

The FIGURE illustrates an embodiment of the present invention.

DETAILED DESCRIPTION

Referring now to the FIGURE, there is illustrated a system 10 comprising a first transceiver T1, a second transceiver T2, a first amplifier-capacitor combination illustrated within dashed line rectangle 12 and to be denoted as circuitry 12, a second amplifier-capacitor combination illustrated within dashed line rectangle 14 and to be denoted as circuitry 14, switching device Q1 having a control terminal 26 and first and second output terminals, a second switching device Q2 having a control terminal 38 and first and second output terminals, capacitors C3, C4, C5, C6 and C7 and electrical conduits Bus 1 and Bus 2. C3, C4, C5, C6 and C7 represent the total capacitive loading of all components and/or a Bus on the terminal to which same is illustrated coupled.

System 10 is bidirectional in that analog or digital information may be transmitted from T1 to T2 or from T2 to T1. Circuitry 12 and circuitry 14 provide amplification and/or level shifting and cause the capacitive loading between T1 and T2 to be reduced from what would exist if circuitry 12 and circuitry 14 were not used. Thus the response time of signals transmitted between T1 and T2 is enhanced.

Circuitry 12 comprises a capacitance means which is illustrated as capacitor CF1, resistors R1 and R2, and an amplifier A1 having a first plus input terminal, a second minus input terminal, and an output terminal. The first plus input terminal of A1 is coupled to a first terminal of CF1, to an input/output terminal of T1, to a first terminal of C3, to a second output terminal of Q2 (which is illustrated as an MOS transistor) through Bus 2, and to first system terminal 16. The output terminal of A1 is coupled to a second terminal of CF1, a first output terminal of Q1 (which is illustrated as an MOS transistor), to a first terminal of R2, to a first terminal of C4, and to a second system terminal 18. R1 is illustrated coupled by a first terminal to a second terminal of R2, to the second minus input terminal of A1 and to a terminal 20. A second terminal of R1 is coupled to a potential source VRef and to a terminal 22. R1 and R2 are used to set the gain of A1 and are not always needed as some amplifiers may have preselected gains. The parasitic capacitance of the first plus input terminal of A1 is not explicitly illustrated and labeled but is included as part of C3. Second terminals of C3 and C4 are coupled to a ground terminal Gnd 1 and to a terminal 24.

Circuitry 14 comprises a capacitance means illustrated as a capacitor CF2, resistors R3 and R4, and an amplifier A2 having a first plus input terminal, a second minus input terminal, and an output terminal. The first plus input terminal of A2 is coupled to a first terminal of CF2, to an input/output terminal of T2, to a first terminal of C5, to a second output terminal of Q1 through an electrical Bus 1, and to a third system terminal 28. The output terminal of A2 is coupled to a first terminal of C6, to a first output terminal of Q2, to a first terminal of R4, and to a fourth system terminal 30. A second terminal of R4 is coupled to the second minus input terminal of A2, to a first terminal of R3, and to a terminal 32. A second terminal of R3 is coupled to a potential source VRef2 and to a terminal 34. Second terminals of C5 and C6 are coupled to a ground terminal Gnd 2 and to a terminal 36. R3 and R4 are used to set the gain of A2 and are not always needed as some amplifiers have preselected gains. The parasitic capacitance of A2 is not explicitly illustrated and labeled but is included as part of C5.

The control (gate) terminals of T1 and T2 are typically coupled to control circuitry (not illustrated) which provides signals that allow essentially only one of T1 or T2 to conduct information (signals) between the output terminals thereof while the other is held non-conductive. A variety of well known control circuits can be used to obtain this function.

System 10 operates as follows: Assuming it is desired to send information from T1 to T2, Q1 is biased on by a control signal applied to gate terminal 26 and Q2 is biased off by a control signal applied to gate terminal 38. A signal from T1 propagates through A1, Q1, Bus 1, and is received at T2 and at the first plus input terminal of A2. Circuitry 12 acts to amplify and/or level shift the information (signal) transmitted from T1 and reaches the first plus input terminal of A1. It further acts to cause the load capacitance C3 to be reduced from the value that would result if A1 were used but if CF1 were not used. Circuitry 14 acts as a single terminal negative capacitance generator which causes the effective value of C5 to be lower than would be the case if circuitry 14 were not coupled to terminal 28. The use of circuitry 14 as a single terminal negative capacitance is disclosed in U.S. patent application Ser. No. 333,400. No information propagates past output terminal 30 of A2 since Q2 is biased off.

If it is later desired to transmit (send) information from T2 to T1, then Q1 is biased off and Q2 is biased on. Circuitry 14 now acts to amplify and/or level shift the signal applied to the first plus input of A2. It further acts to cause the load capacitance C5 to be reduced from the value that would result if just A2 were used but if CF2 were not used. Circuitry 12 acts as a single terminal negative capacitance generator which causes the effective value of C3 to be lower than would be the case if circuitry 12 were not coupled to terminal 16. The use of circuitry 12 as a single terminal negative capacitance is disclosed in U.S. patent application, Ser. No. 333,400. No information propagates past output terminal 18 of A1 since Q1 is biased off.

With Q1 biased on and Q2 biased off, information can be transmitted from T1 through A1, Q1 and Bus 1 and be received by T2 with the capacitance on terminal 16 being reduced by circuitry 12, the information being amplified and/or level shifted by A1, and the capacitance on terminal 28 being reduced by circuitry 14. With Q2 biased on and Q1 biased off, information can be transmitted from T2 through A2, Q2, and Bus 2 and be received by T2 with the capacitance on terminal 28 being reduced by circuitry 14, the information being amplified and/or level shifted by A2, and the capacitance on terminal 16 being reduced by circuitry 12. The reduction in the capacitive loading on terminals 16 and 28 serves to enhance the response time of information transferred between T1 and T2.

In many useful cases the response time of amplifiers A1 and A2 should be approximately two times or greater less than that of the enhanced response time expected and the gain of A1 and A2 should be approximately two or greater. The response time of information received at T1 is proportional to the ratio of CF1 to C3 and the response time of information received at T2 is proportional to the ratio of CF2 to C5. As these ratios of capacitance decrease the corresponding response time are enhanced (decreased).

The embodiments described herein are intended to be illustrative of the general principles of the invention. Various modifications are possible consistent with the spirit of the invention. For example, switching devices Q1 and Q2 could be bipolar transistors, JFETS, gated diode switches, or a variety of other types of switches. Amplifier 1 and 2 could have different gains and response times and need not be identical. CF1 and CF2 may also have different values as may C3, C4, C5, and C6. Still further, T1 could be just a transmitter or just a receiver and correspondingly T2 could be just a receiver or a transmitter. Still further, additional transceivers, and/or receivers, and/or transmitters could be coupled to terminals 16 and 28. Still further, separate voltage dividers can be inserted between the output terminal A1 of circuitry 12 and the first output terminal of Q1 and between the output terminal of A2 of circuitry 14 and the first output terminal of Q2 in order to attenuate information (signals) and/or to match the impedance of the bus being driven.

What is claimed is:

1. In combination:

first and second amplifiers each having a first input terminal and an output terminal;

first and second capacitance means each having first and second terminals;

the first and second terminals of the first capacitance means being coupled to the first input terminal and to the output terminal of the first amplifier, respectively;

the first and second terminals of the second capacitance means being coupled to the first input terminal and to the output terminal of the second amplifier, respectively;

the first input terminal of each of the first and second amplifiers being adapted to be coupled to a transmitter, a receiver, or a transceiver;

first and second switching devices each having a control terminal and first and second output terminals;

a first electrical conduit (bus, data bus, conductor) having a capacitance associated therewith and being coupled by a first terminal thereof to the second output terminal of the first switching device and being coupled by a second terminal thereof to the first input terminal of the second amplifier;

a second electrical conduit (bus, data bus, conductor) having a capacitance associated therewith and being coupled by a first terminal to the second output terminal of the second switching device and being coupled by a second terminal thereof to the first input terminal of the first amplifier;

the output terminal of the first amplifier being coupled to the first output terminal of the first switching device;

the output terminal of the second amplifier being coupled to the first output terminal of the first switching device;

the gain of the first amplifier and the value of the first capacitance means being selected such that total load capacitance on the input terminal of the first amplifier is less than would be the case if the first capacitance means were not utilized;

the gain of the second amplifier and the value of the second capacitance means being selected such that total load capacitance on the input terminal of the second amplifier is less than would be the case if the second capacitance means were not utilized; and the first and second switching devices being adapted to be coupled by the respective control terminals thereof to control means which selectively allows essentially only one of the switching means to be conductive at a given time.

2. The combination of claim 1 wherein the gain of the first and second amplifiers is two or greater and the response time of the first amplifier is approximately two times or greater less than that of a desired response time of information transmitted through the second electrical conduit and the response time of the second amplifier is approximately two times or greater less than that of a desired response time of information transmitted through the first electrical conduit.

3. The combination of claim 2 wherein:

the output terminals of the first and second amplifiers are non-inverting output terminals;

the first input terminals of the first and second amplifiers are plus input terminals; and the first and second amplifiers each have a second minus input terminal.

4. A bidirectional communication system comprising:

first and second transceivers;

first and second amplifiers each having at least one input terminal and an output terminal;

first and second capacitance means each having first and second terminals;

first and second switching means each having a control terminal and first and second output terminals;

the first transceiver being coupled to a first input terminal of the first amplifier, to the first terminal of the first capacitance means, to a second output terminal of the second switching means through a second electrical conduit, and to a first system terminal;

the second terminal of the first capacitance means being coupled to the output terminal of the first amplifier, to the first output terminal of the first switching means, and to a second system terminal;

the second transceiver being coupled to a first input terminal of the second amplifier, to the first terminal of the second capacitance means, to a second output terminal of the first switching means through a first electrical conduit, and to a third system terminal;

the second terminal of the second capacitance means being coupled to the output terminal of the second amplifier, to the first output terminal of the second switching device, and to a fourth system terminal;

the first and second switching means being adapted to be coupled by the respective control terminals thereof to control means which selectively allows essentially only one of the switching means to be conductive at a given time;

the gain of the first amplifier and the value of the first capacitance means being selected such that total load capacitance on the input terminal of the first amplifier is less than would be the case if the first capacitance means were not utilized;

the gain of the second amplifier and the value of the second capacitance means being selected such that total load capacitance on the input terminal of the second amplifier is less than would be the case if the second capacitance means were not utilized; and the first and second switching devices being adapted to be coupled by the respective control terminals thereof to control means which selectively allows essentially only one of the switching means to be conductive at a given time.

5. The combination of claim 4 wherein the gain of the first and second amplifiers is two or greater and the response time of the first amplifier is approximately two times or greater less than that of a desired response time of information transmitted through the second conductor and the response time of the second amplifier is approximately two times or greater less than that of a desired response time of information transmitted through the first conductor.

6. The combination of claim 5 wherein:

the output terminals of the first and second amplifiers are non-inverting output terminals;

the first input terminals of the first and second amplifiers are plus input terminals; and the first and second amplifiers each have a second minus input terminal.

* * * * *